(12) United States Patent
Zhang et al.

(10) Patent No.: US 7,508,249 B2
(45) Date of Patent: Mar. 24, 2009

(54) DISTRIBUTED TRANSISTOR STRUCTURE FOR HIGH LINEARITY ACTIVE CATV POWER SPLITTER

(75) Inventors: Shuyun Zhang, Allston, MA (US); Yibing Zhao, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 79 days.

(21) Appl. No.: 11/491,717

(22) Filed: Jul. 24, 2006

(65) Prior Publication Data

US 2007/0024352 A1    Feb. 1, 2007

Related U.S. Application Data

(60) Provisional application No. 60/702,957, filed on Jul. 27, 2005.

(51) Int. Cl.
*H03K 17/687* (2006.01)

(52) U.S. Cl. .................. 327/427; 327/434; 327/430; 330/277; 330/264

(58) Field of Classification Search .......... 331/65; 375/242; 388/830; 463/6; 330/277, 264; 327/427, 434, 430
See application file for complete search history.

(56) References Cited

U.S. PATENT DOCUMENTS

| | | | | |
|---|---|---|---|---|
| 3,609,580 A * | 9/1971 | Thompson et al. | ............ | 331/65 |
| 3,909,719 A * | 9/1975 | Martens | ............ | 375/242 |
| 4,105,105 A * | 8/1978 | Braum | ............ | 194/319 |
| 4,121,142 A * | 10/1978 | Morser et al. | ............ | 388/830 |
| 4,128,761 A * | 12/1978 | Oehler | ............ | 250/222.1 |
| 4,241,316 A * | 12/1980 | Knapp | ............ | 330/277 |
| 4,334,221 A * | 6/1982 | Rosenhagen et al. | ............ | 463/6 |
| 4,496,909 A * | 1/1985 | Knapp | ............ | 330/277 |
| 4,500,830 A * | 2/1985 | Gotou et al. | ............ | 323/267 |
| 4,570,129 A * | 2/1986 | Milberger | ............ | 330/277 |
| 4,590,613 A * | 5/1986 | Tannery, IV | ............ | 455/200.1 |
| 4,779,037 A * | 10/1988 | LoCascio | ............ | 323/275 |
| 5,235,288 A * | 8/1993 | Rinderle et al. | ............ | 330/264 |
| 6,081,159 A | 6/2000 | Kim et al. | | |
| 6,340,918 B2 * | 1/2002 | Taylor | ............ | 330/292 |
| 6,369,657 B2 * | 4/2002 | Dening et al. | ............ | 330/296 |
| 6,952,120 B2 * | 10/2005 | Rahman et al. | ............ | 327/108 |
| 7,212,043 B2 * | 5/2007 | Gatta et al. | ............ | 327/77 |
| 7,276,888 B2 * | 10/2007 | Thiele et al. | ............ | 323/282 |
| 2001/0011926 A1 * | 8/2001 | Adar | ............ | 330/126 |
| 2001/0045863 A1 * | 11/2001 | Pelly | ............ | 327/552 |
| 2003/0020545 A1 | 1/2003 | Joly et al. | | |
| 2003/0112076 A1 | 6/2003 | Wang | | |
| 2005/0121526 A1 * | 6/2005 | Stewart et al. | ............ | 235/492 |
| 2006/0186958 A1 * | 8/2006 | Carreto et al. | ............ | 330/267 |

(Continued)

FOREIGN PATENT DOCUMENTS

EP    1359665 A2    11/2003

*Primary Examiner*—Lincoln Donovan
*Assistant Examiner*—Adam Houston
(74) *Attorney, Agent, or Firm*—Kenyon & Kenyon LLP

(57) ABSTRACT

A transistor cell includes a first stage comprising a first transistor that is coupled to a RC filter arrangement. A second stage has a second transistor that is coupled to the first stage. The linearity of the transistor cell is improved by shifting the DC bias point so that the first stage is biased at a high quiescent current while the second stage is biased at a low quiescent current.

16 Claims, 4 Drawing Sheets

U.S. PATENT DOCUMENTS

2006/0202738 A1* 9/2006 Gatta et al. .................. 327/427
2007/0018794 A1* 1/2007 Bares et al. ................ 340/10.3
2007/0194812 A1* 8/2007 Gatta et al. ................... 327/77
2007/0210871 A1* 9/2007 Kim et al. ................... 330/285

* cited by examiner

DISTRIBUTED TRANSISTOR STRUCTURE FOR HIGH LINEARITY ACTIVE CATV POWER SPLITTER

PRIORITY INFORMATION

This application claims priority from provisional application Ser. No. 60/702,957 filed Jul. 27, 2005, which is incorporated herein by reference in its entirety.

BACKGROUND OF THE INVENTION

The invention relates to the field of linearized transistors for a linear amplifier stage and in particular to circuits which employ a transistor cell to produce a high linearity amplifier.

There are many kinds of linearization techniques for amplifier designs. All these techniques employ circuitry around the nonlinear active transistor cell. FIG. 1 shows an example of an active transistor cell 20. The transistor cell 20 includes a FET 22 having a gate 26, source 28, and drain 30. The gate 26 and drain 30 and each are coupled to their corresponding voltages Vg and Vd, while the source 28 is coupled to ground. Moreover, a resistor 24 is coupled between the drain 30 and source 28 of the FET 22. However, in prior art the relationship between the transconductance gm1 of the FET 22 and the gate to source voltage (Vgs) are tightly correlated and thus degrades the linearity of FET 22.

SUMMARY OF THE INVENTION

According to one aspect of the invention, there is provided a transistor cell used to produce a highly linear output. The transistor cell includes a first stage having a first transistor that is coupled to a RC filter arrangement. A second stage includes a second transistor that is parallel to the first stage. The linearity of the transistor cell is improved by shifting the DC bias point so that the first stage is biased at a low quiescent current while the second stage is biased at a high quiescent current.

According to another aspect of the invention, there is provided a method of producing a highly linear output from a transistor cell. The method includes providing a first stage having a first transistor that is coupled to a RC filter arrangement. Also, the method includes providing a second stage comprising a second transistor that is coupled to the first stage. The linearity of the transistor cell is improved by shifting the DC bias point so that the first stage is biased at a low quiescent current while the second stage is biased at a high quiescent current.

DETAILED DESCRIPTION OF THE INVENTION

This invention involves a linearized transistor for a linear amplifier stage, and such a circuit that employs a transistor cell to produce a high linearity amplifier output. Moreover, the invention provides a transistor design that can be used to generate a linearized transistor cell.

Figure 1:
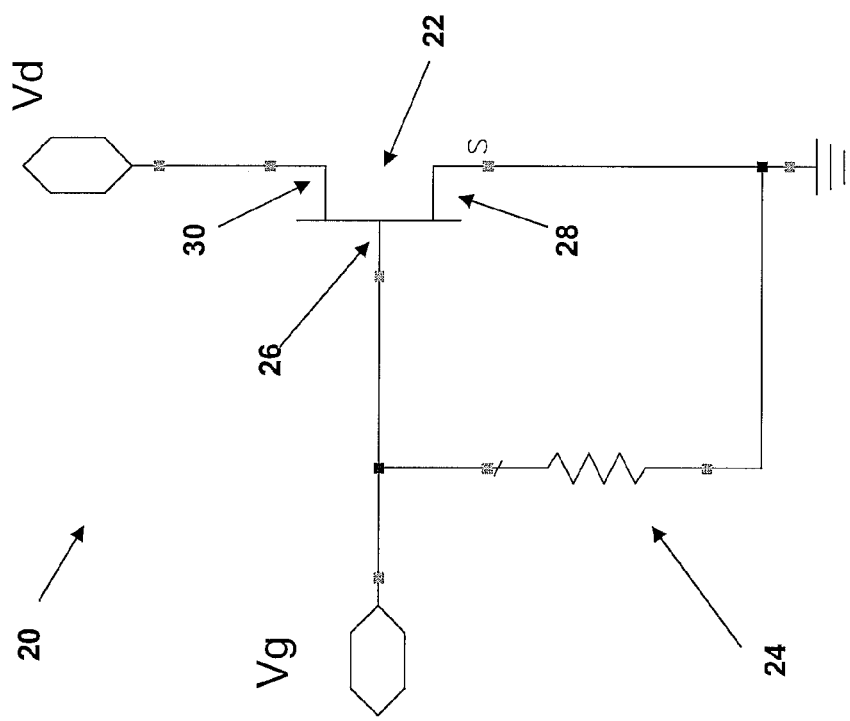
FIG. 1 is a circuit diagram illustrating a transistor cell used in the prior art.

One can define a current vs. input voltage of the FET 22 shown in FIG. 1 as $$i_d(v_{gs}) = g_{m1}v_{gs} + g_{m2}v_{gs}^2 + g_{m3}v_{gs}^3 + \ldots \qquad \text{Eq. 1}$$

where gms (gm1, gm2, gm3, ...) are transconductance values associated with the FET 22, id is the drain current, and Vgs is the voltage between the gate and source. For an ideal linear transistor, high order gms are all zero, i.e. only gm1 exists. If high order gms are not zero then the transistor is nolinear therefore it generates the high order current components, as shown in Equation 1.

However, one still can make gm2 and gm3 reasonably small to improve linearity of the transistor cell. One can get the following relationship $$i_d(v_{gs}) \approx g_{m1}v_{gs} \qquad \text{EQ. 2}$$

where the current id has a linear relation with Vgs as gm1 of the transistor cell is independent of Vgs.

Figure 2:
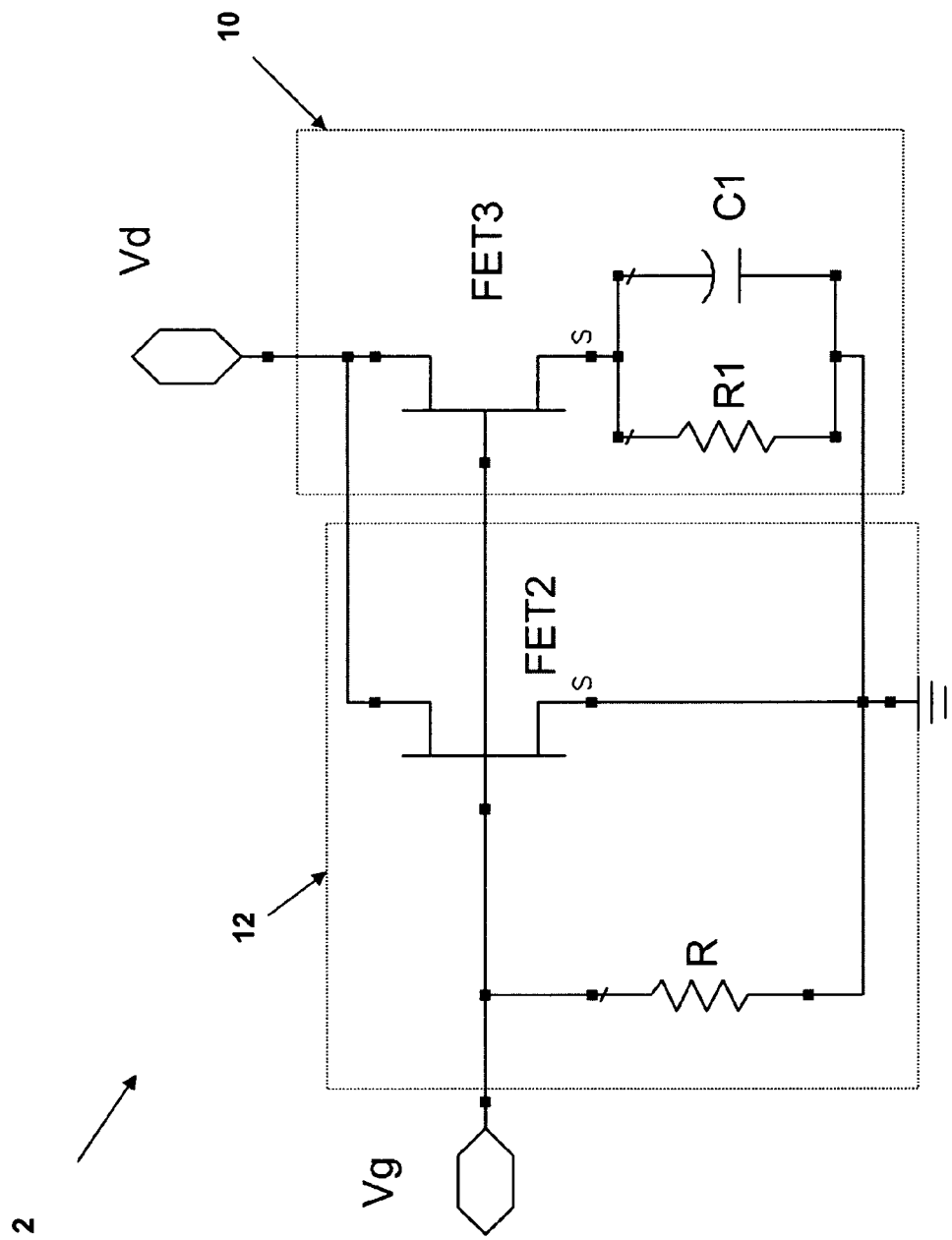
FIG. 2 is a circuit diagram illustrating a transistor cell designed in accordance with the invention.

FIG. 2 shows the circuit design of the inventive linearized transistor cell 2. The linearized transistor cell 2 includes a FET 3. The drain of the FET 3 is coupled to a voltage Vd. The source of FET 3 is coupled to a resistor R1 and capacitor C1 that are themselves coupled in a parallel arrangement to form a RC filter. The gate of FET 3 is coupled to the gate of a FET 2. The drain of FET 2 is also coupled to the voltage Vd, and the source of FET 2 is coupled to the bottom ends of the resistor R1 and the capacitor C1. The source of FET 2 is also coupled to a resistor R at one end. The other end of the resistor R is coupled to the gate of FET 2. Moreover, the gate of FET 2 is also coupled to a voltage source Vg.

The range of Vd should not be fixed in general, as it could be between Knee voltage and the operational voltage of the transistor. The Vgs determines drain-source current ids. Vgs in general is between pinch-off voltage Vp and 0 volts. However, for different type of transistors Vgs range can be different. Given the Vgs value, the degeneration resistor R1 value is then determined by Vgs=−|ids*R1| provided the gate potential is 0 Volt. The capacitor C1 value is as high as possible if the device covers reasonable low frequency.

The transistor cell 2 can be divided into two stages 10 and 12. The first stage 10 comprises the FET 3, the resistor R1, and the capacitor C1. The second stage 12 includes FET 2 and the resistor R. Note the second stage 12 and the transistor cell shown in FIG. 1 is quite similar. The difference between the prior art and the invention is the incorporation of stage 10. The linearized transistor cell 2 improves the linearity by shifting the DC bias point at different points for the FET transistors FET 3 and FET 2. In this case, the stage 10 is biased at a low quiescent current while the stage 12 is biased at a high quiescent current. By doing this, one can achieve better linearity than the original single uniform transistor.

Figure 3:
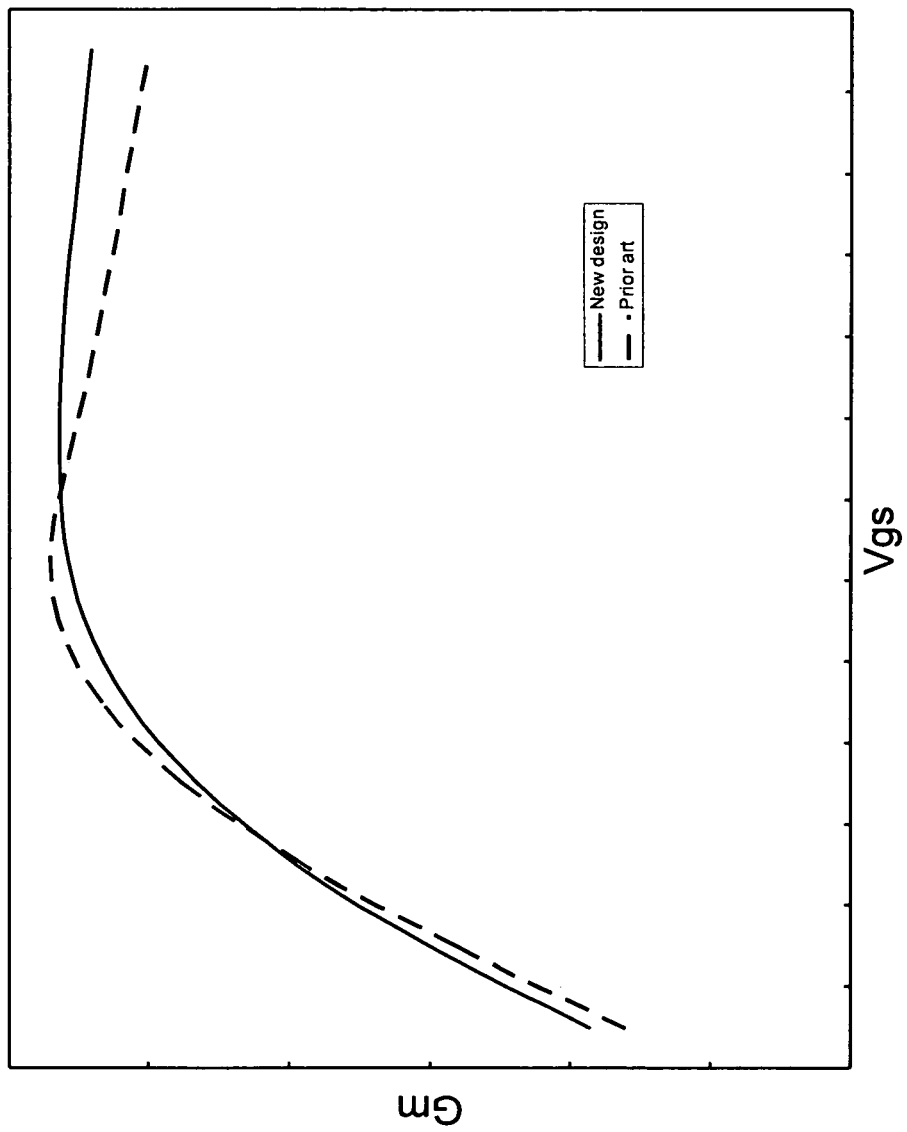
FIG. 3 is a graph demonstrating the comparison in the transconductance between the prior art and the invention.

FIG. 3 shows a comparison of the improvement of the transconductance between the prior art and the invention. The transconductance Gm curve of the prior art varies over a large range of Vgs. Note the transconductance curve of the invention illustrates similar properties as those possess by current in a DC RC-filter arrangement. The transconductance curve for the invention also shows independence between the Vgs and the transconductance Gm for large Vgs values. The invented device exhibits the relationship, as shown in Eq. 2 thus having high linearity.

Figure 4:
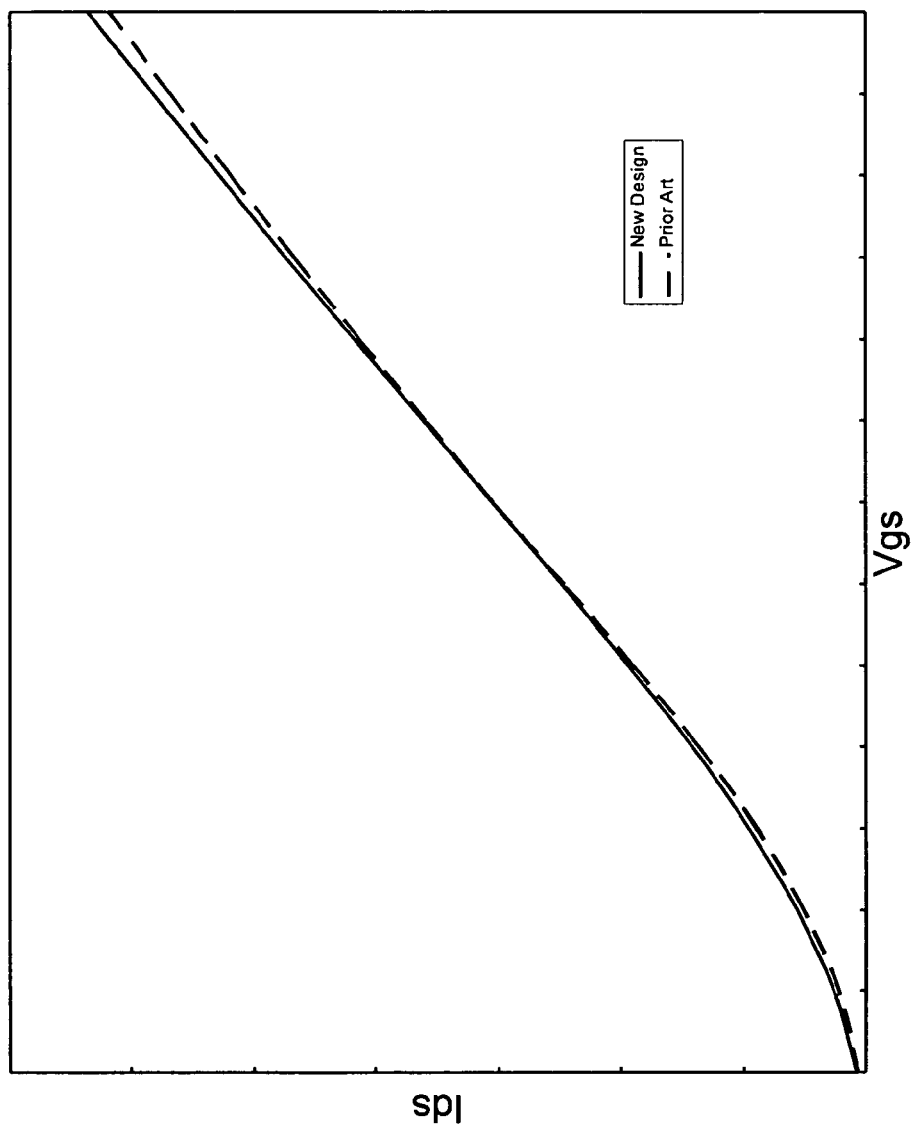
FIG. 4 is a graph demonstrating the comparison in the drain current between the prior art and the invention.

FIG. 4 shows a comparison of the linear relationship of the drain current in the prior art and the invention. The drain current using the prior art deviates substantially from linearity at small changes in Vgs. The drain curing produced by the invention maintains its linearity for large ranges of Vgs, thus illustrating high linearity.

The inventive approach is to design a linear transistor cell having the ability to accommodate for shifting in the DC bias points. The approach used is easy to implement in any transistor layout without requiring substantial modification. Moreover, the invention can also be included with devices requiring high linear outputs, such as power amplifier, active power splitters, or other similarly situated devices.

Although the present invention has been shown and described with respect to several preferred embodiments thereof, various changes, omissions and additions to the form and detail thereof, may be made therein, without departing from the spirit and scope of the invention.

What is claimed is:

1. A transistor cell used in producing highly linear output comprising:
   a first stage having a first transistor that is coupled to a RC filter arrangement; and
   a second stage having a second transistor that is coupled to the gate of said first transistor of said first stage, the gates of said first transistor and second transistor are coupled to a first voltage source and the drains of said first transistor and second transistor are coupled to second voltage source, said second stage comprising a resistor that is coupled to the gate and the source of said second transistor;
   wherein the linearity of said transistor cell is improved by shifting the DC bias point so that the first stage is biased at a low quiescent current while the second stage is biased at a high quiescent current.

2. The transistor cell of claim 1, wherein said RC filter arrangement comprises a first resistor and capacitor arranged in a parallel configuration relative to each other.

3. The transistor of claim 1, wherein said RC filter arrangement is coupled to the source of said first transistor.

4. The transistor cell of claim 1, wherein said first transistor is couple to the gate of said second transistor.

5. The transistor cell of claim 1, wherein the gate of said second transistor is coupled to a second resistor.

6. The transistor cell of claim 1, wherein the source of said second transistor is coupled to ground.

7. The transistor cell of claim 1, wherein said first transistor comprises a FET.

8. The transistor cell of claim 1, wherein said second transistor comprises a FET.

9. A method of producing a highly linear output from a transistor cell comprising:
   providing a first stage comprising a first transistor that is coupled to a RC filter arrangement; and
   providing a second stage comprising a second transistor that is coupled to the gate of said first transistor of said first stage, the gates of said first transistor and second transistor are coupled to a first voltage source and the drains of said first transistor and second transistor are coupled to second voltage source, said second stage comprising a resistor that is coupled to the gate and the source of said second transistor;
   wherein the linearity of said transistor cell is improved by shifting the DC bias point so that the first stage is biased at a low quiescent current while the second stage is biased at a high quiescent current.

10. The method of claim 9, wherein said RC filter arrangement comprises a first resistor and capacitor arranged in a parallel configuration relative to each other.

11. The method of claim 9, wherein said RC filter arrangement is coupled to the source of said first transistor.

12. The method of claim 9, wherein said first transistor is couple to the gate of said second transistor.

13. The method of claim 9, wherein the gate of said second transistor is coupled to a second resistor.

14. The method of claim 9, wherein the source of said second transistor is coupled to ground.

15. The method of claim 9, wherein said first transistor comprises a FET.

16. The method of claim 9, wherein said second transistor comprises a FET.

* * * * *